US009640489B2

(12) United States Patent
Hung et al.

(10) Patent No.: US 9,640,489 B2
(45) Date of Patent: *May 2, 2017

(54) SEAL RING STRUCTURE WITH CAPACITOR

(71) Applicant: MediaTek Inc., Hsin-Chu (TW)

(72) Inventors: Cheng-Chou Hung, Hukou Township, Hsinchu County (TW); Tung-Hsing Lee, New Taipei (TW); Yu-Hua Huang, Hsinchu (TW); Ming-Tzong Yang, Baoshan Township, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/320,725

(22) Filed: Jul. 1, 2014

(65) Prior Publication Data

US 2014/0312470 A1 Oct. 23, 2014

Related U.S. Application Data

(63) Continuation of application No. 13/351,151, filed on Jan. 16, 2012, now Pat. No. 8,810,001.

(60) Provisional application No. 61/505,587, filed on Jul. 8, 2011, provisional application No. 61/496,447, filed on Jun. 13, 2011.

(51) Int. Cl.
| | |
|---|---|
| *H01L 21/02* | (2006.01) |
| *H01L 23/00* | (2006.01) |
| *H01L 23/58* | (2006.01) |
| *H01L 29/94* | (2006.01) |
| *H01L 27/08* | (2006.01) |

(52) U.S. Cl.
CPC .......... *H01L 23/562* (2013.01); *H01L 23/564* (2013.01); *H01L 23/585* (2013.01); *H01L 27/0805* (2013.01); *H01L 29/94* (2013.01); *H01L 2924/0002* (2013.01)

(58) Field of Classification Search
CPC ........................... H01L 23/562; H01L 23/564
USPC ......................................... 257/532, E29.342
See application file for complete search history.

(56) References Cited

U.S. PATENT DOCUMENTS

| | | | | |
|---|---|---|---|---|
| 6,492,716 B1 * | 12/2002 | Bothra | ................. | H01L 23/552 |
| | | | | 257/678 |
| 8,334,582 B2 | 12/2012 | Jeng et al. | | |
| 2003/0071280 A1 | 4/2003 | Yu et al. | | |
| 2003/0183823 A1 | 10/2003 | Searls et al. | | |
| 2005/0110119 A1 * | 5/2005 | Chen | ..................... | H01L 23/585 |
| | | | | 257/620 |
| 2005/0280007 A1 * | 12/2005 | Hsu | ..................... | H01L 27/1462 |
| | | | | 257/79 |

(Continued)

FOREIGN PATENT DOCUMENTS

| | | |
|---|---|---|
| CN | 1653611 | 8/2005 |
| CN | 101615598 | 12/2009 |
| WO | WO 03/083942 | 10/2003 |

*Primary Examiner* — Igwe U Anya
(74) *Attorney, Agent, or Firm* — McClure, Qualey & Rodack, LLP (57) ABSTRACT

A semiconductor device includes a semiconductor substrate of a first conductivity type having a chip region enclosed by a seal ring region. An insulating layer is on the semiconductor substrate. A seal ring structure is embedded in the insulating layer corresponding to the seal ring region. And, a plurality of doping regions are located beneath the first seal ring structure.

24 Claims, 7 Drawing Sheets

(56) References Cited

U.S. PATENT DOCUMENTS

| | | |
|---|---|---|
| 2006/0017087 A1 | 1/2006 | Tamaru et al. |
| 2006/0102980 A1* | 5/2006 | Nakashiba .................... 257/508 |
| 2006/0197214 A1* | 9/2006 | Chen ............................ 257/688 |
| 2006/0202831 A1* | 9/2006 | Horch ....................... 340/572.7 |
| 2006/0206277 A1* | 9/2006 | Horch ............................. 702/82 |
| 2007/0013071 A1* | 1/2007 | Adkisson ............... H01L 22/32 |
| | | 257/758 |
| 2007/0241422 A1 | 10/2007 | Chen |
| 2008/0061397 A1* | 3/2008 | Uchida ........................ 257/508 |
| 2008/0099886 A1* | 5/2008 | Kadoyama et al. .......... 257/659 |
| 2008/0283969 A1* | 11/2008 | Jeng et al. .................... 257/620 |
| 2009/0121322 A1 | 5/2009 | Ozawa |
| 2009/0294897 A1* | 12/2009 | Lee .................... H01L 23/5225 |
| | | 257/509 |
| 2009/0294929 A1* | 12/2009 | Lee .................... H01L 23/5225 |
| | | 257/659 |
| 2009/0321890 A1* | 12/2009 | Jeng et al. .................... 257/620 |
| 2010/0200947 A1* | 8/2010 | Hung et al. ................... 257/510 |
| 2011/0006389 A1* | 1/2011 | Bachman et al. ............ 257/508 |
| 2011/0241182 A1* | 10/2011 | Herberholz et al. .......... 257/629 |
| 2011/0309465 A1* | 12/2011 | Chen et al. ................... 257/503 |
| 2012/0038028 A1* | 2/2012 | Yaung et al. ................. 257/620 |

\* cited by examiner

SEAL RING STRUCTURE WITH CAPACITOR

CROSS REFERENCE TO RELATED APPLICATIONS

This application is a continuation of application Ser. No. 13/351,151, filed on Jan. 26, 2012, now U.S. Pat. No. 8,811,132, which claims the benefit of U.S. Provisional Application No. 61/496,447, filed Jun. 13, 2011, and U.S. Provisional Application No. 61/505,587, filed Jul. 8, 2011, the entireties of which are incorporated by reference herein.

BACKGROUND OF THE INVENTION

Field of the Invention

The invention relates to a semiconductor device and more particularly to a seal ring structure with a capacitor.

Description of the Related Art

In the manufacturing of integrated circuits (ICs), seal ring (also called as a guard ring) formation is an important part for semiconductor processes. A semiconductor device such as an IC is manufactured in a form of a chip cut out from a semiconductor wafer having an IC pattern formed thereon. A plurality of chips are formed by dicing the semiconductor wafer. In the dicing process, semiconductor chips are separated from each other, and mechanical stress such as vibration is usually applied to the semiconductor substrate/wafer. Accordingly, a crack on the chip may be caused when the dicing process is performed.

Moreover, a plurality of semiconductor elements are formed on the semiconductor substrate. At this time, stacked insulating films, such as intermetal dielectric (IMD) films and/or interlayer dielectric (ILD) films, deposited during formation of the semiconductor elements are exposed from the cut section of the dicing line portions. These stacked insulating films and interfaces therebetween create paths for moisture to penetrate, and may cause a malfunction of the semiconductor device.

In order to prevent semiconductor chips from damage caused by the dicing process and from moisture-induced degradation, a seal ring structure is provided between an IC pattern region and a dicing line of each chip. A conventional seal ring structure is formed in the process for forming wiring layers and contact portions and is a multi-layer structure composed of alternating metal and insulating layers. Vias are formed in each of the insulating layers to provide electrical paths between adjacent metal layers. However, the lowermost metal layer in the seal structure electrically contacts with the semiconductor substrate and thus creates a substrate short-circuit path around the semiconductor chip. The seal ring structure provides a very low resistance metal path around the periphery of the semiconductor chip, such that noise can travel from the IC region of the semiconductor chip to the seal ring structure, resulting in the substrate noise coupling issue.

Accordingly, there is a need to develop a novel seal ring structure which is capable of mitigating or eliminating the aforementioned problem.

BRIEF SUMMARY OF THE INVENTION

An exemplary embodiment of a semiconductor device comprises a semiconductor substrate of a conductivity type having a chip region enclosed by a seal ring region. An insulating layer is on the semiconductor substrate. A seal ring structure is embedded in the insulating layer corresponding to the seal ring region. A capacitor is disposed under the seal ring structure and is electrically connected thereto, wherein the capacitor comprises a body of the semiconductor substrate.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description encompasses the fabrication process and the purpose of the invention. It can be understood that this description is provided for the purpose of illustrating the fabrication process and the use of the invention and should not be taken in a limited sense. In the drawings or disclosure, the same or similar elements are represented or labeled by the same or similar symbols. Moreover, the shapes or thicknesses of the elements shown in the drawings may be magnified for simplicity and convenience. Additionally, the elements not shown or described in the drawings or disclosure are common elements which are well known in the art.

Figure 1:
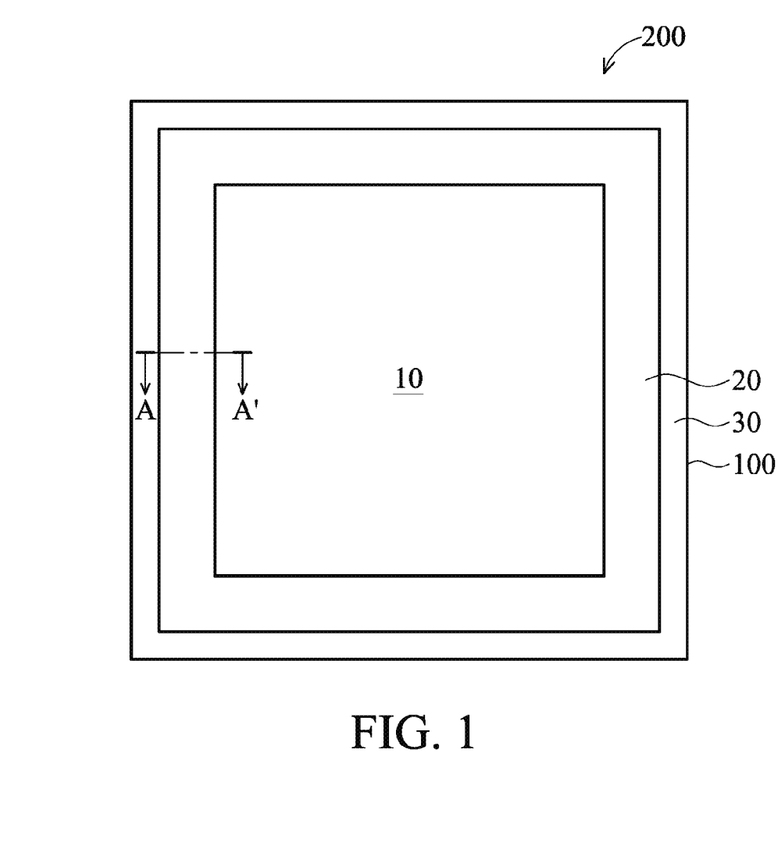
FIG. 1 is a plan view of an exemplary embodiment of a semiconductor device including seal ring structures according to the invention.
Figure 2:
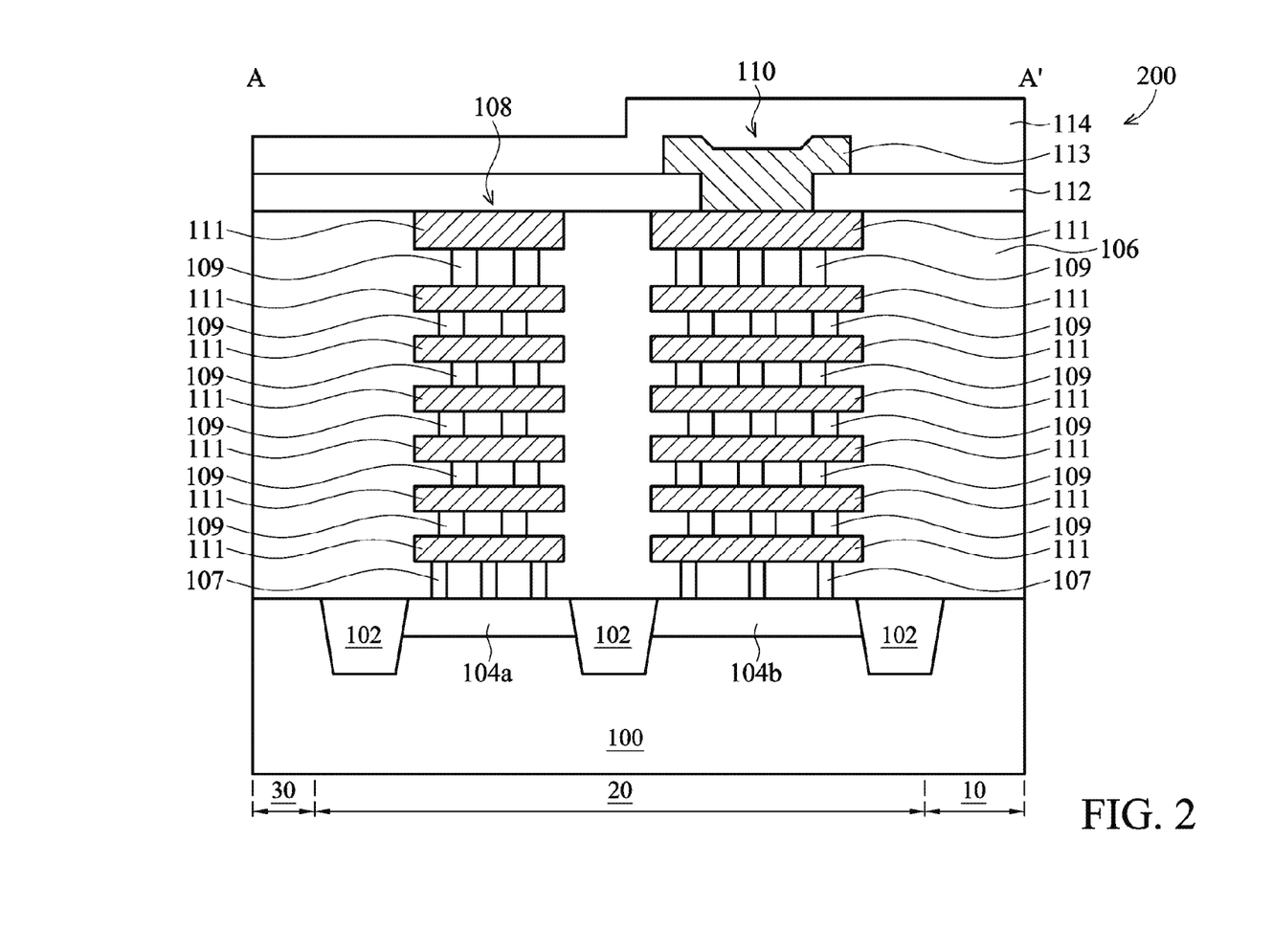
FIG. 2 is a cross section along A-A' line in FIG. 1.

Referring to FIGS. 1 and 2, which respectively illustrate a plane view of an exemplary embodiment of a semiconductor device including seal ring structures according to the invention and a cross section along A-A' line in FIG. 1. The semiconductor device 200 comprises a semiconductor substrate 100 of a first conductivity type (e.g., p-type or n-type). The semiconductor substrate 100 may comprises silicon, silicon germanium, gallium arsenic or other semiconductor material. In one embodiment, the semiconductor substrate 100 has a chip region 10, a seal ring region 20 enclosing the chip region 10, and a scribe line region 30 enclosing the seal ring region 20, as shown in FIG. 1A. The chip region 10 is for forming a variety of elements, including transistors, resistors, and other semiconductor elements which are well known in the art. The seal ring region 20 is for forming seal ring structures thereon and the scribe line region 30 is for performing a dicing process to form an individual chip from a semiconductor wafer. The seal ring region 20 of the semiconductor substrate 100 may further comprise an isolation structure 102 formed therein for isolating and enclosing dummy active regions. In one embodiment, the isolation structure 102 is a shallow trench isolation (STI) structure. Alternatively, the isolation structure 102 may be a local oxidation of silicon (LOCOS) feature.

An insulating layer 106 is formed on the semiconductor substrate 100 corresponding to the chip region 10, the seal ring region 20, and the scribe line region 30. The insulating layer 106 may be a single layer or a multi-layer structure to serve as an ILD or IMD layer and comprise oxide, nitride, oxynitride, or combinations thereof, or low k material, such as fluorinated silicate glass (FSG), carbon doped oxide, methyl silsesquioxane (MSQ), hydrogen silsesquioxane (HSQ), or fluorine tetra-ethyl-orthosilicate (FTEOS). The insulating layer 106 may be formed by, for example, chemical vapor deposition (CVD), low pressure chemical vapor deposition (LPCVD), plasma enhanced chemical vapor deposition (PECVD), high density plasma chemical vapor deposition (HDPCVD) or other deposition processes well known in the art.

A first seal ring structure 108 is embedded in the insulating layer 106 corresponding to the seal ring region 20. The first seal ring structure 108 may comprise a plurality of metal layers 111 (such as a copper layer) in a stack (i.e., the plurality of metal layers 111 are in different levels of the insulating layer 106, such that the metal layers 111 therein are separated from each other) and a plurality of via bars 109 disposed between the plurality of metal layers 111 in different levels of the insulating layer 106. The plurality of via bars 109 is formed of, for example, copper (other metals are applicable and may be used), and electrically connected to the respective plurality of metal layers 111. The first seal ring structure 108 can be formed during the formation of the wiring layers and contact portions in the chip region 10 can be formed by, for example, a dual damascene process. In one embodiment, the first seal ring structure 108 may have a width of about 3 µm.

In the embodiment, a first capacitor is disposed under the first seal ring structure 108 and electrically connected thereto by a plurality of contact vias 107 formed in the insulating layer 106. Particularly, the first capacitor comprises a body of the semiconductor substrate 100. In one embodiment, the first capacitor is a junction capacitor composed of a doping region 104a and the body of the semiconductor substrate 100, wherein the doping region 104a has a second conductivity type opposite to the first conductivity type and is formed in one of the dummy active regions enclosed by the isolation structure 102, such that the doping region 104a is formed within the semiconductor substrate 100 of the seal ring region 20 and encloses the chip region 10. In one embodiment, the semiconductor substrate 100 is p-type and thus the doping region 104a is n-type, such as an $n^+$ doping region. In other embodiments, the semiconductor substrate 100 is n-type and thus the doping region 104a is p-type, such as a $p^+$ doping region. The first capacitor (i.e., junction capacitor) typically has a low capacitance, thus resulting in a great impendence, thereby effectively blocking the noise from the chip region 10.

In the embodiment, the body of the semiconductor substrate 100 may further comprise a well region (not shown) of the same conductivity type as that of the semiconductor substrate 100, such that the first capacitor (i.e., the junction capacitor) is composed of the doping region 104a and the well region thereunder.

The semiconductor device 200 further comprises a second seal ring structure 110 and a second capacitor. The second seal ring structure 110 is embedded in the insulating layer 106 corresponding to the seal ring region 20 and enclosed by the first seal ring structure 108. The second seal ring structure 110 may comprise a plurality of metal layers 111 in a stack and a plurality of via bars 109 disposed between the plurality of metal layers 111 that are the same as that of the first seal ring structure 108. Moreover, the second seal ring structure 110 may further comprise a metal pad 113 formed of aluminum (other metals are applicable and may be used), and electrically coupled to the uppermost metal layer 111 of the second seal ring structure 110. The first seal ring structure 108 and the second seal ring structure 110 can be formed simultaneously by the same process. In one embodiment, the second seal ring structure 110 may have a width greater than that of the first seal ring structure 108. For example, the second seal ring structure 110 has a width of about 4 nm. Moreover, the second seal ring structure 110 may be spaced apart from the first seal ring structure 108 by a distance of about 2 µm and spaced apart from the chip region 10 by a distance of about 6 µm.

The second capacitor is disposed under the second seal ring structure 110 and electrically connected thereto by the plurality of contact vias 107. The second capacitor also comprises the body of the semiconductor substrate 100. In one embodiment, the second capacitor is a junction capacitor composed of a doping region 104b and the body of the semiconductor substrate 100, wherein the doping region 104b has the same conductivity type as that of the doping region 104a and is formed in another dummy active region, such that the doping region 104b is formed within the semiconductor substrate 100 of the seal ring region 20 and encloses the chip region 10. In the embodiment, the doping region 104b may be an $n^+$ or $p^+$ doping region. Also, the impendence of the second capacitor (i.e., junction capacitor) is typically great, which effectively blocks the noise from the chip region 10.

The semiconductor device 200 further comprise a first passivation layer 112 and a second passivation layer 114 subsequently deposited above the semiconductor substrate 100 and covering the first seal ring structure 108 and the second seal ring structure 110, wherein the first passivation layer 112 has an opening to expose the metal pad 113 of the second seal ring structure 110. In one embodiment, the first passivation layer 112 and the second passivation layer 114 are formed of the same material, such as silicon oxide or silicon nitride. In another embodiment, the first passivation layer 112 and the second passivation layer 114 are formed of different materials. For example, the first passivation layer 112 is formed of an inorganic material (e.g., silicon oxide or silicon nitride) and the second passivation layer 114 is formed of an organic material (e.g., solder mask).

According to the foregoing embodiments, since the seal ring structures are electrically connected to a respective junction capacitor with a great impendence, substrate noise coupling can be effectively prevented.

Figure 3:
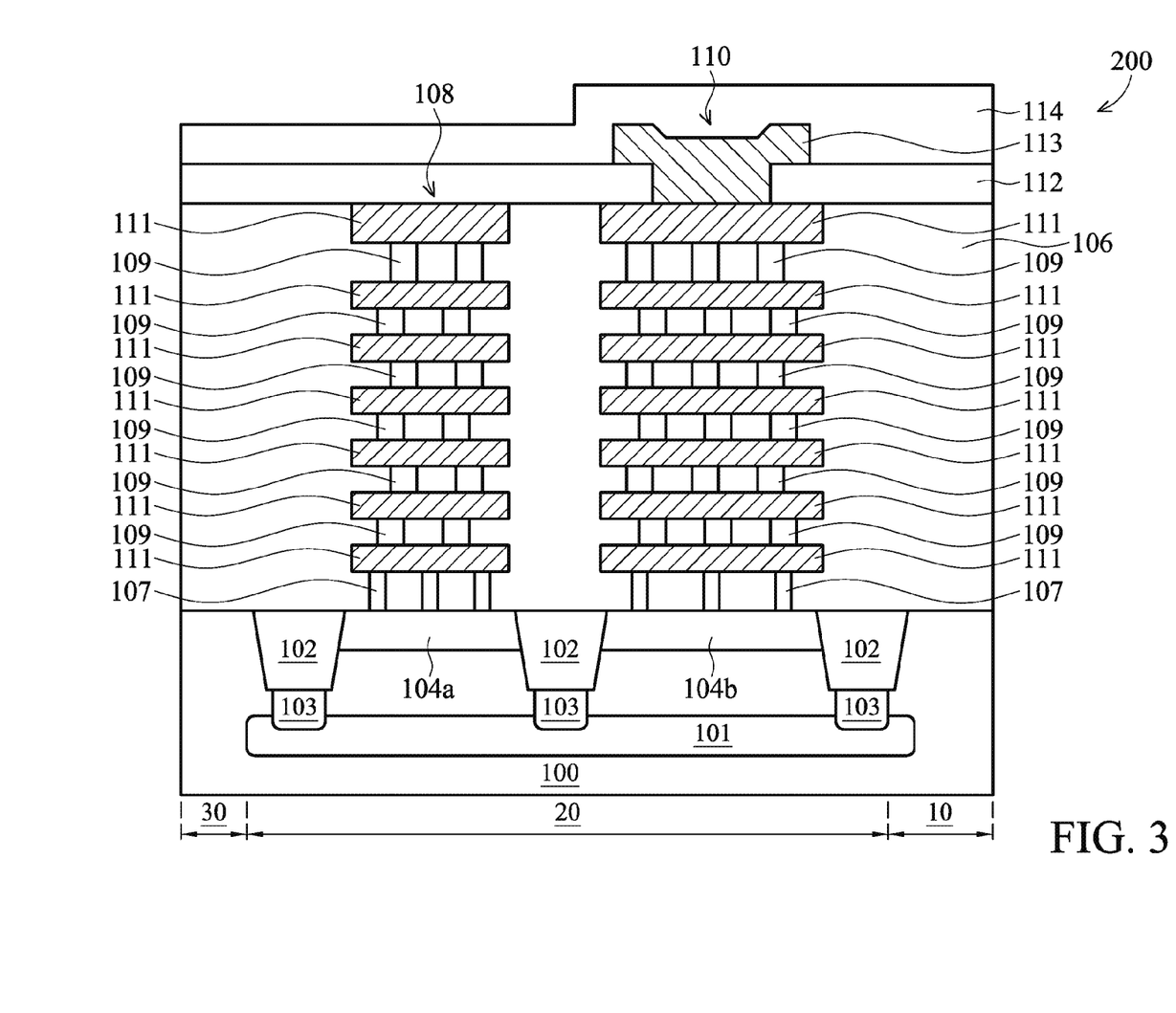
FIGS. 3 to 7 are cross sections of various exemplary embodiments of a semiconductor device including seal ring structures according to the invention.

Referring to FIG. 3, which illustrates a cross section of an exemplary embodiment of a semiconductor device including seal ring structures according to the invention. Elements in FIG. 3 that are the same as those in FIG. 2 are labeled with the same reference numbers as in FIG. 2 and are not described again for brevity. The semiconductor device 200 has a similar structure as that shown in FIG. 2 except for the first and second capacitors. In the embodiment, the first capacitor, which is electrically connected to the first seal ring structure 108, further comprises a doping region 103 of the second conductivity type and a deep well region 101 of the same conductivity type as that of the doping region 103. For example, the semiconductor substrate 100 is p-type and thus the doping region 103 and the deep well region 101 are n-type, such as an $n^+$ doping region and a deep $n^+$ well region, respectively. Alternatively, the semiconductor substrate 100 is p-type, and thus the doping region 103 and the deep well region 101 are p-type, such as a $p^+$ doping region and a deep $p^+$ well region, respectively.

Both of the doping region 103 and the deep well region 101 are within the semiconductor substrate 100 of the seal ring region 20, such that a portion of the body of the semiconductor substrate 100 is interposed between the doping region 104a and the deep well region 101 and is enclosed by the doping region 103. The doping region 103 may be disposed directly under the isolation structure 102 enclosing the doping region 104a.

As a result, the first capacitor shown in FIG. 3 may comprise first, second, and third sub-capacitors electrically connected in series, wherein the first sub-capacitor is composed of the doping region 104a and the portion of the body of the semiconductor substrate 100 between the doping region 104a and the deep well region 101 and is enclosed by the doping region 103. The second sub-capacitor is composed of the deep well region 101 and the portion of the body of the semiconductor substrate 100 between the doping region 104a and the deep well region 101 and is enclosed by the doping region 103. Additionally, the third sub-capacitor is composed of the deep well region 101 and a portion of the body of the semiconductor substrate 100 thereunder. The first capacitor with three sub-capacitors electrically connected in series has a smaller capacitance than that shown in FIG. 2, resulting in a greater impendence than that shown in FIG. 2.

In the embodiment, the second capacitor, which is electrically connected to the second seal ring structure 110, further comprises the doping region 103 and the deep well region 101 of the second conductivity type. Both of the doping region 103 and the deep well region 101 are within the semiconductor substrate 100 of the seal ring region 20, such that a portion of the body of the semiconductor substrate 100 is interposed between the doping region 104b and the deep well region 101 and is enclosed by the doping region 103.

Also, the second capacitor shown in FIG. 3 may comprise three sub-capacitors electrically connected in series, wherein the first one is composed of the doping region 104b and the portion of the body of the semiconductor substrate 100 between the doping region 104b and the deep well region 101 and is enclosed by the doping region 103. Moreover, the second one is composed of the deep well region 101 and the portion of the body of the semiconductor substrate 100 between the doping region 104b and the deep well region 101 and is enclosed by the doping region 103. Additionally, the third one is composed of the deep well region 101 and a portion of the body of the semiconductor substrate 100 thereunder. The second capacitor with three sub-capacitors electrically connected in series also has a smaller capacitance than that shown in FIG. 2, resulting in a greater impendence than that shown in FIG. 2.

Accordingly, according to the foregoing embodiments, since the seal ring structures are electrically connected to a respective capacitor with a greater impendence than that shown in FIG. 2, the substrate noise coupling issue can be further improved.

Figure 4:
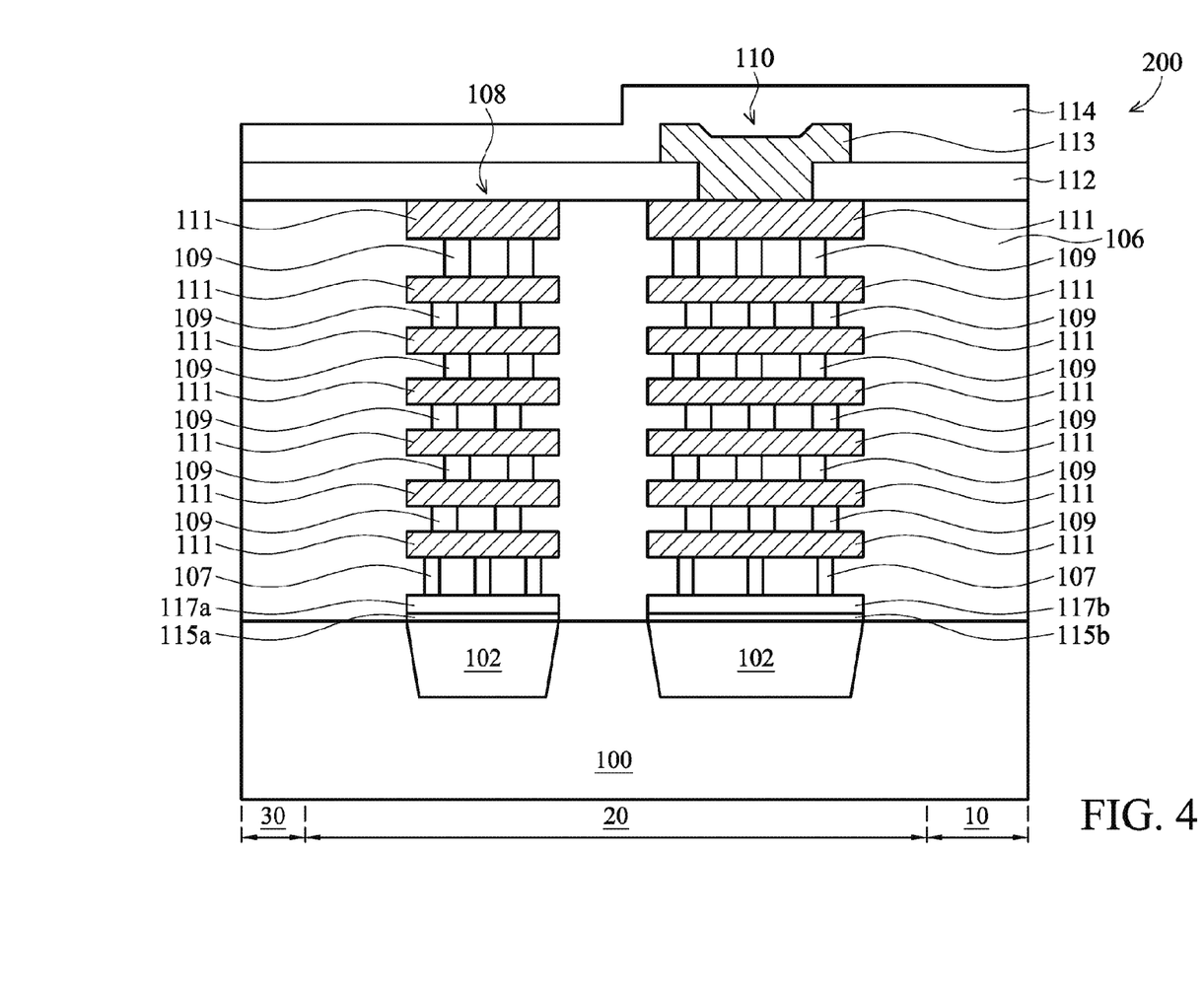

Referring to FIG. 4, which illustrates a cross section of an exemplary embodiment of a semiconductor device including seal ring structures according to the invention. Elements in FIG. 4 that are the same as those in FIG. 2 are labeled with the same reference numbers as in FIG. 2 and are not described again for brevity. The semiconductor device 200 has a similar structure as that shown in FIG. 2 except for the first and second capacitors. In the embodiment, the first capacitor, which is electrically connected to the first seal ring structure 108 by the plurality of contact vias 107, is a PIS (polysilicon/insulator/semiconductor) capacitor and comprises the body of the semiconductor substrate 100, a portion of the isolation structure 102 and a polysilicon layer 117a thereon, wherein the polysilicon layer 117a is interposed between the portion of the isolation structure 102 and the first seal ring structure 108 and encloses the chip region 10.

Moreover, the second capacitor, which is electrically connected to the second seal ring structure 110 by the plurality of contact vias 107, is a PIS capacitor and comprises the body of the semiconductor substrate 100, a portion of the isolation structure 102 and a polysilicon layer 117b thereon, wherein the polysilicon layer 117b is interposed between the portion of the isolation structure 102 and the second seal ring structure 110 and encloses the chip region 10. The polysilicon layers 117a and 117b can be formed in the process for formation of the polysilicon gates of transistors (not shown) in the chip region 10, and thus no additional process for formation of the polysilicon layers 117a and 117b is required.

In the embodiment, the first and second capacitors may further comprise dielectric layers 115a and 115b, respectively, wherein the dielectric layer 115a is interposed between the polysilicon layer 117a and a portion of the isolation structure 102, and the dielectric layer 115b is interposed between the polysilicon layer 117b and another portion of the isolation structure 102. The dielectric layers 115a and 115b can be formed in the process for formation of the gate dielectric layers of transistors (not shown) in the chip region 10, and thus no additional process for formation of the dielectric layers 115a and 115b is required.

The first and second capacitors having a PIS structure has a low capacitance due to a thicker isolation structure 102, thus resulting in a great impendence, thereby effectively blocking the noise from the chip region 10.

According to the foregoing embodiments, since the seal ring structures are electrically connected to a respective PIS capacitor with a great impendence, the substrate noise coupling can also be effectively prevented.

Figure 5:
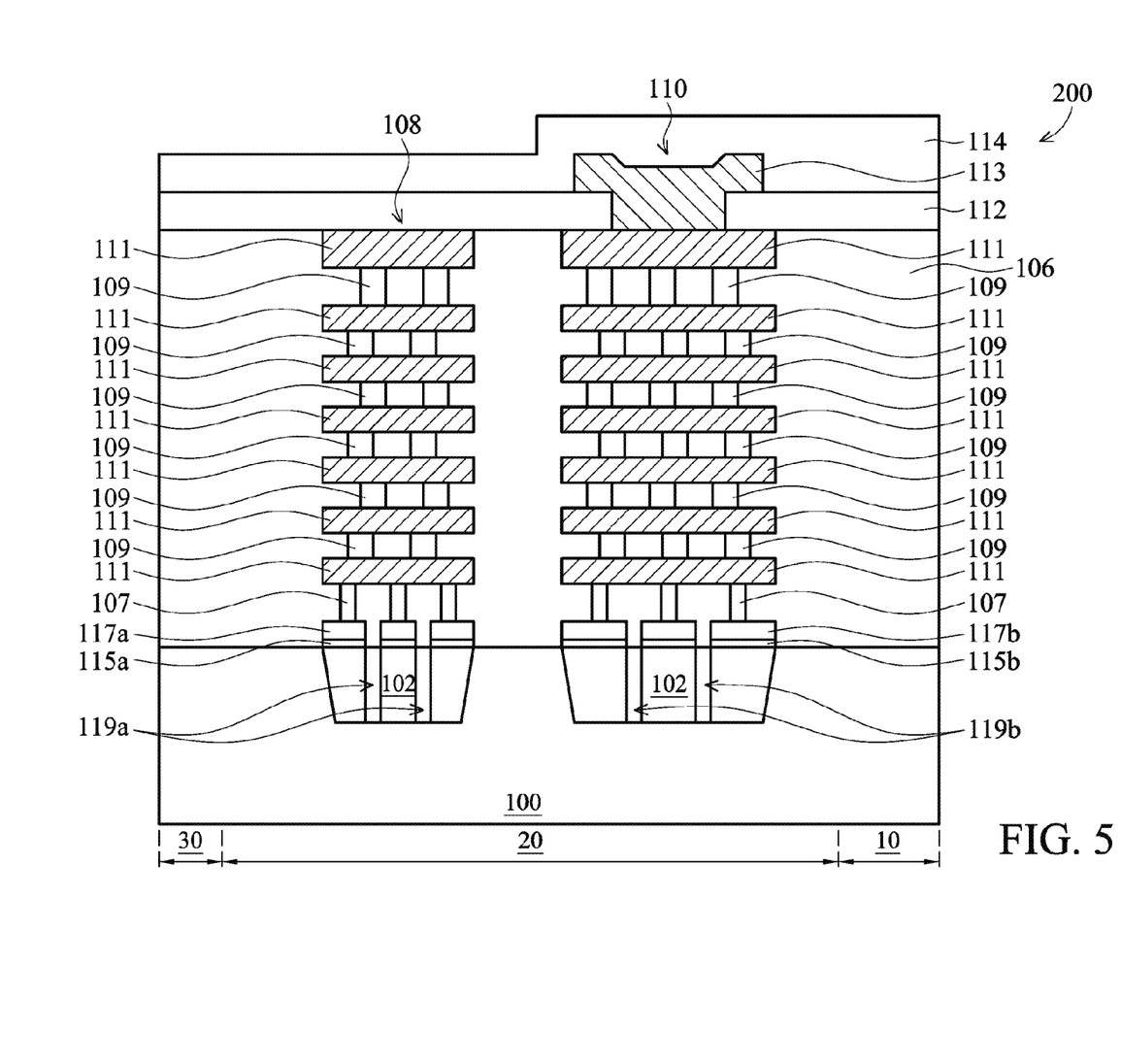

Referring to FIG. 5, which illustrates a cross section of an exemplary embodiment of a semiconductor device including seal ring structures according to the invention. Elements in FIG. 5 that are the same as those in FIG. 4 are labeled with the same reference numbers as in FIG. 4 and are not described again for brevity. The semiconductor device 200 has a similar structure as that shown in FIG. 4 except for the first and second capacitors. In the embodiment, the first capacitor further comprises at least one opening 119a cutting the isolation structure 102, the dielectric layer 115a, and the first polysilicon layer 117a. Also, the second capacitor further comprises at least one opening 119b cutting the isolation structure 102, the dielectric layer 115b, and the second polysilicon layer 117b. Moisture is easily trapped in the insulator formed of oxide. Therefore, the openings 119a and 119b can reduce the contact area of the isolation structure 102 with moisture, thereby mitigating moisture degradation.

According to the foregoing embodiments, since the seal ring structures are electrically connected to a respective PIS capacitor with openings therein, the substrate noise coupling can also be effectively prevented while moisture degradation can be mitigated.

Figure 6:
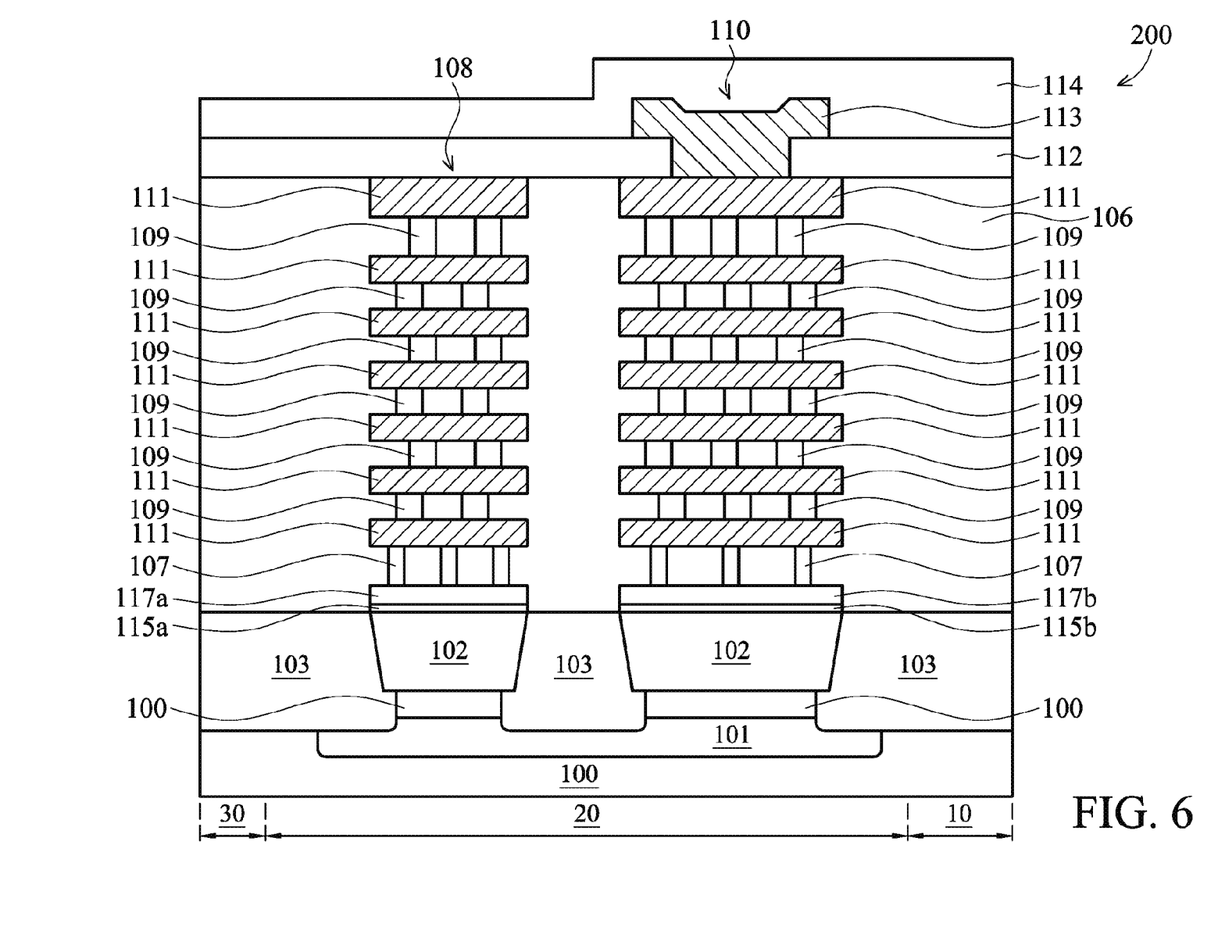

Referring to FIG. 6, which illustrates a cross section of an exemplary embodiment of a semiconductor device including seal ring structures according to the invention. Elements in FIG. 6 that are the same as those in FIG. 4 are labeled with the same reference numbers as in FIG. 4 and are not described again for brevity. The semiconductor device 200 has a similar structure as that shown in FIG. 4 except for the first and second capacitors. In the embodiment, each of the first and second capacitors further comprises a doping region 103 of the second conductivity type and a deep well region 101 of the same conductivity type as that of the doping region 103. Both of the doping region 103 and the deep well region 101 are within the semiconductor substrate 100 of the seal ring region 20, such that a portion of the body of the semiconductor substrate 100 is interposed between the isolation structure 102 and the deep well region 101 and is enclosed by the doping region 103. The doping region 103 may be disposed in the dummy active regions enclosed by the isolation structure 102.

As a result, each of the first and second capacitors shown in FIG. 6 may comprise first, second, and third sub-capacitors electrically connected in series, wherein the first sub-capacitor is composed of the first or second polysilicon layer 117a or 117b, the optional dielectric layer 115a or 115b, and the isolation structure 102. The second sub-capacitor is composed of the deep well region 101 and the portion of the body of the semiconductor substrate 100 between the isolation structure 102 and the deep well region 101 and is enclosed by the doping region 103. Additionally, the third sub-capacitor is composed of the deep well region 101 and a portion of the body of the semiconductor substrate 100 thereunder. The first and second capacitors with three sub-capacitors electrically connected in series have smaller capacitances than that shown in FIG. 4, resulting in a greater impendence than that shown in FIG. 4.

Accordingly, according to the foregoing embodiment, since the seal ring structures are electrically connected to a respective capacitor with a greater impendence than that shown in FIG. 4, the substrate noise coupling issue can be further improved.

Figure 7:
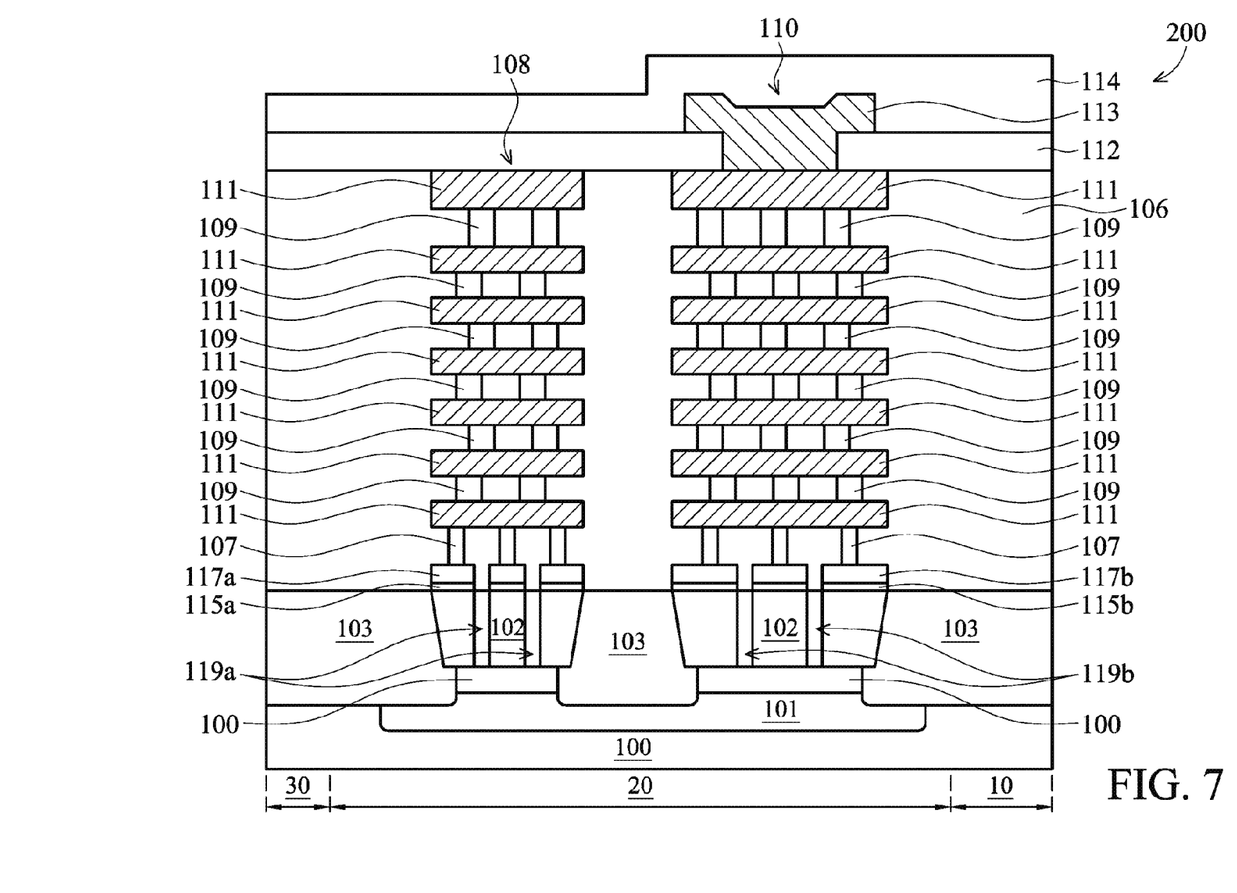

Referring to FIG. 7, which illustrates a cross section of an exemplary embodiment of a semiconductor device including seal ring structures according to the invention. Elements in FIG. 7 that are the same as those in FIGS. 5 and 6 are labeled with the same reference numbers as in FIGS. 5 and 6 and are not described again for brevity. The semiconductor device 200 has a similar structure as that shown in FIG. 5 or 6 except for the first and second capacitors. In the embodiment, each of the first and second capacitors includes three sub-capacitors which are similar to that shown in FIG. 6.

Moreover, unlike the first and second capacitors shown in FIG. 6, the first sub-capacitor in each of the first and second capacitors further comprises at least one opening 119a or 119b cutting the isolation structure 102, the dielectric layer 115a or 115b, and the first or second polysilicon layer 117a or 117b.

According to the foregoing embodiments, since the seal ring structures are electrically connected to a respective capacitor with three sub-capacitors electrically connected in series, the substrate noise coupling can also be effectively prevented. Moreover, one of the three sub-capacitors that has a PIS structure has openings therein, thus, moisture degradation can be mitigated.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a semiconductor substrate of a first conductivity type having a chip region enclosed by a seal ring region;
   an insulating layer on the semiconductor substrate;
   a first seal ring structure embedded in the insulating layer corresponding to the seal ring region; and
   a shallow trench isolation (STI) structure located directly beneath the first seal ring structure such that the first seal ring structure overlies the STI structure, wherein at least one opening cutting the STI structure into different portions.

2. The semiconductor device of claim 1, further comprising:
   a second seal ring structure embedded in the insulating layer corresponding to the seal ring region and enclosed by the first seal ring structure.

3. The semiconductor device of claim 2, wherein the second seal ring structure comprises a plurality of metal layers in a stack enclosing the chip region and a plurality of via bars electrically connected to the respective plurality of metal layers.

4. The semiconductor device of claim 2, wherein the first seal ring structure comprises a plurality of metal layers in a stack enclosing the second seal ring structure and a plurality of via bars electrically connected to the respective plurality of metal layers.

5. The semiconductor device of claim 2, wherein the second seal ring structure has a width greater than that of the first seal ring structure.

6. The semiconductor device of claim 2, further comprises a first passivation layer and a second passivation layer subsequently covering the first seal ring structure and the second seal ring structure.

7. The semiconductor device of claim 6, wherein the first passivation layer has an opening exposing the second seal ring structure.

8. The semiconductor device of claim 7, wherein the second seal ring structure comprises a metal pad in the opening of the first passivation layer.

9. The semiconductor device of claim 2, further comprising:
   a second capacitor disposed under the second seal ring structure and electrically connected thereto, wherein the second capacitor comprises a body of the semiconductor substrate.

10. The semiconductor device of claim 9, wherein the second capacitor further comprises a first sub-capacitor, a second sub-capacitor and a third sub-capacitor electrically connected in series, wherein the first sub-capacitor is composed of the doping region and a portion of a body of the semiconductor substrate between the doping region and a deep well region and is enclosed by the doping region, the second sub-capacitor is composed of the deep well region and the portion of the body of the semiconductor substrate between the doping region and the deep well region and is enclosed by the doping region, and the third sub-capacitor is composed of the deep well region and a portion of the body of the semiconductor substrate thereunder.

11. The semiconductor device of claim 2, further comprising:
   a polysilicon layer, interposed between a portion of the isolation structure and the second seal ring structure and encloses the chip region.

12. The semiconductor device of claim 11, further comprising:
   a dielectric layer, interposed between the polysilicon layer and a portion of the isolation structure.

13. The semiconductor device of claim 12, wherein a portion of a body of the semiconductor substrate is interposed between the isolation structure and a deep well region and is enclosed by the doping region.

14. The semiconductor device of claim 13, wherein the at least one opening cuts the isolation structure, the dielectric layer, and the first polysilicon layer.

15. The semiconductor device of claim 1, wherein a body of the semiconductor substrate comprises a well region of the first conductivity type.

16. The semiconductor device of claim 1, further comprising:
a first capacitor disposed under the first seal ring structure and electrically connected thereto, wherein the first capacitor comprises a body of the semiconductor substrate.

17. The semiconductor device of claim 16, wherein the first capacitor further comprises a first sub-capacitor, a second sub-capacitor and a third sub-capacitor electrically connected in series, wherein the first sub-capacitor is composed of the doping region and a portion of a body of the semiconductor substrate between the doping region and a deep well region and is enclosed by the doping region, the second sub-capacitor is composed of the deep well region and the portion of the body of the semiconductor substrate between the doping region and the deep well region and is enclosed by the doping region, and the third sub-capacitor is composed of the deep well region and a portion of the body of the semiconductor substrate thereunder.

18. The semiconductor device of claim 1, further comprising:
a polysilicon layer, interposed between a portion of the isolation structure and the first seal ring structure and encloses the chip region.

19. The semiconductor device of claim 18, further comprising:
a dielectric layer, interposed between the polysilicon layer and a portion of the isolation structure.

20. The semiconductor device of claim 19, wherein a portion of a body of the semiconductor substrate is interposed between the isolation structure and a deep well region and is enclosed by the doping region.

21. The semiconductor device of claim 20, wherein the at least one opening cuts the isolation structure, the dielectric layer, and the first polysilicon layer.

22. The semiconductor device of claim 1, further comprising:
a plurality of doping regions located beneath the first seal ring structure, wherein the plurality of doping regions has a second conductivity type opposite to the first conductivity type.

23. The semiconductor device of claim 22, further comprising:
a second seal ring structure embedded in the insulating layer corresponding to the seal ring region and enclosed by the first seal ring structure, wherein the plurality of doping regions is located beneath the second seal ring structure.

24. A semiconductor device, comprising:
a semiconductor substrate of a first conductivity type having a chip region enclosed by a seal ring region;
an insulating layer on the semiconductor substrate;
a first seal ring structure embedded in the insulating layer corresponding to the seal ring region;
a plurality of doping regions located beneath the first seal ring structure, wherein the plurality of doping regions has a second conductivity type opposite to the first conductivity type;
an isolation structure located directly beneath and aligned with the first seal ring structure;
a polysilicon layer, interposed between a portion of the isolation structure and the first seal ring structure and encloses the chip region;
a dielectric layer, interposed between the polysilicon layer and a portion of the isolation structure; and
at least one opening cutting the isolation structure, the dielectric layer, and the first polysilicon layer.

* * * * *